United States Patent [19]

Kumagai

[11] 4,424,096

[45] Jan. 3, 1984

[54] R-F ELECTRODE TYPE WORKHOLDER AND METHODS OF SUPPORTING WORKPIECES DURING R-F POWERED REACTIVE TREATMENT

[75] Inventor: Henry Y. Kumagai, Allentown, Pa.

[73] Assignee: Western Electric Co., Inc., New York, N.Y.

[21] Appl. No.: 452,680

[22] Filed: Dec. 23, 1982

[51] Int. Cl.³ .................. B44C 1/22; C03C 15/00; C03C 25/06; C23C 15/00
[52] U.S. Cl. .................. 156/643; 118/728; 118/620; 156/345; 204/192 R; 204/192 E; 204/298; 427/39; 428/336; 428/627; 428/698
[58] Field of Search .......... 156/345, 643, 646; 204/164, 142 EC, 192 E, 192 R, 298; 118/728, 620; 313/306–308, 326; 428/336, 428, 627, 698; 427/38, 39

[56] References Cited

U.S. PATENT DOCUMENTS

| | | |
|---|---|---|
| 3,980,854 | 9/1976 | Berkman et al. .......... 427/45 X |
| 4,073,669 | 2/1978 | Heinecke et al. .......... 156/643 |
| 4,292,153 | 9/1981 | Kudo et al. .......... 204/164 |
| 4,302,498 | 11/1981 | Faith .......... 428/209 |
| 4,336,304 | 6/1982 | Landingham et al. .......... 428/336 |

Primary Examiner—William A. Powell
Attorney, Agent, or Firm—W. O. Schellin

[57] ABSTRACT

Workpieces (11), such as semiconductor wafers, are treated in a plasma reaction apparatus (10). The wafers are loaded onto a workholder (18), where they become seated in contact with facing surfaces of a plurality of spaced, parallel plates (19, 21). Plasma is generated in each of the spaces (23) between two adjacent ones of the plates by coupling such adjacent plates to opposite terminals (31, 32) of an R-F generator (29). Each of the plates is comprised of a base structure (41) of a thermally stable, conductive material, such as graphite. The base structure is covered with a first layer (43) of a hard material, such as silicon carbide to impart wear resistance to the graphite. The layer (43), in turn, is covered by an outer, conductive layer (44) which, in the described embodiment is a layer of aluminum.

14 Claims, 2 Drawing Figures

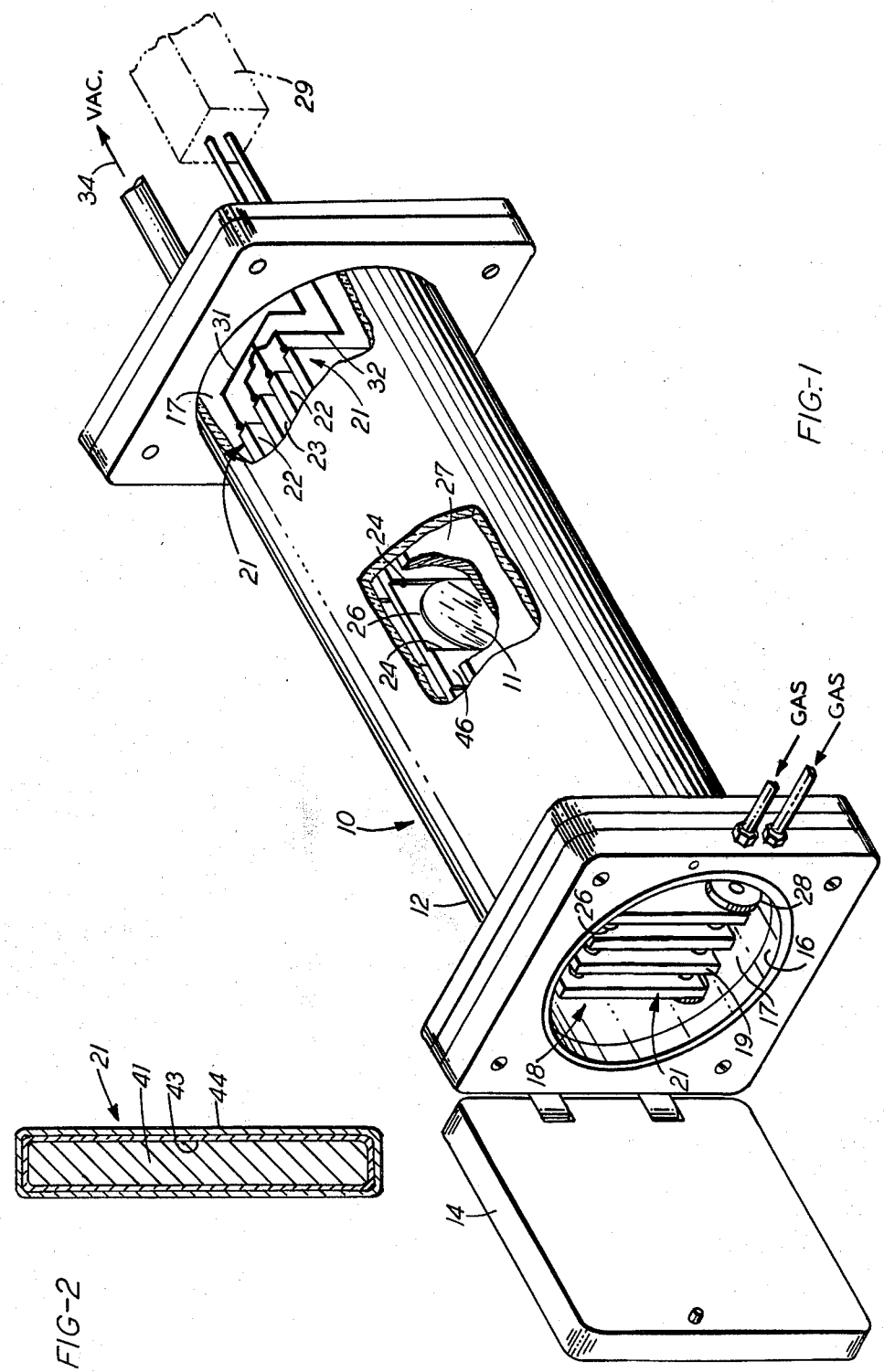

R-F ELECTRODE TYPE WORKHOLDER AND METHODS OF SUPPORTING WORKPIECES DURING R-F POWERED REACTIVE TREATMENT

TECHNICAL FIELD

This invention relates to a radio frequency (R-F) electrode which also supports workpieces during R-F energy reactive treatment processes. The invention relates particularly to the structure of such an electrode-workholder combination and to methods of supporting workpieces, such as semiconductor wafers in plasma treating processes.

BACKGROUND OF THE INVENTION

In the recent past plasma reactive treatment processes have taken on significance in the manufacture of microcircuits and particularly in the manufacture of semiconductor integrated circuits. In preparation for treatment in a plasma reactive process, workpieces, such as semiconductor wafers, are loaded onto a workholder, and the workholder is placed into a reaction chamber. The reaction chamber is sealed, evacuated and back filled with reactant gases at a controlled pressure which is typically much lower than atmospheric pressure. An R-F energy field is then established within the chamber to raise the energy level of the reactant gases within the chamber without significantly raising the temperature of the apparatus and of the wafers. The reactant gases at the raised molecular energy level are referred to as plasma; hence, the name "plasma reaction" by which the ensuing treatment process is characterized.

While the reactant gases are at the high energy level, the gas molecules readily separate into radicals such that chemical reactions take place readily at a rapid rate even though the concentration of the gases within the plasma is low in comparison to the molecular concentration of gases at atmospheric pressure. A major advantage of a plasma reactive process is that it is a dry chemical reaction which leaves no noticeable chemical residues on the surfaces of the wafers once the process is terminated. Another advantage is the speed at which the process takes place, since the reaction is essentially a high energy reaction, with the added benefit that the apparatus temperatures including those of the wafers do not rise to a level where the temperatures can deleteriously affect previously generated microstructures on the surfaces of the wafers.

Most commonly known plasma-reactive processes are plasma etching processes and chemical vapor deposition (CVD) processes. In the plasma etching processes the reactant gas is a gas which chemically attacks and dissolves selective materials to which it is exposed. Plasma etching processes are used for selectively removing portions of previously deposited films, whereby other portions remain shielded by film patterns which resist the attack by the plasma reactants. In other plasma etching processes blanket removal of a deposited material is effected. This type of plasma etching is also used for cleaning tools and workholders prior to subjecting them to the other type of processes, such as the CVD operation wherein films are deposited on the wafers.

In the latter CVD type process the reactant gases are gases which, upon being raised to the plasma state, typically react with each other to deposit an element or a compound as a solid film on the exposed surfaces of the wafers. Of course, surface portions of the workholder supporting the wafers, to the extent that they are not shielded from the plasma reaction by the wafers, also become coated with such films. Since those films would grow in thickness as the workholders are used repeatedly, the workholders are routinely etch-cleaned in a plasma reaction operation.

A typical workholder with respect to which the present invention will be described serves two purposes. Firstly, it provides a support for the wafers in an orderly arrangement within the reaction chamber to expose them substantially equally to the plasma generated during the process. Secondly, the workholder in the preferred process also provides the R-F electrodes between which the plasma is generated. In the described apparatus the reaction chamber is a long, horizontally disposed tube. The workholder is in the shape of a plurality of parallel, rectangular plates which are spaced and oriented, such that major surfaces of adjacent plates face each other. The wafers are mounted against such facing major surfaces within the spaces between the plates. The plates are coupled into an R-F circuit with alternately opposite polarity, such that a plasma cloud can be generated in each space between two adjacent plates.

A preferred material for the plates in the referred to state-of-the-art CVD apparatus is graphite. Graphite is electrically conductive, and, furthermore, remains structurally stable over the entire working temperature range of such apparatus. Such temperature stability is of particular significance, since for a reaction within the chamber to equally affect all wafers held against the major surfaces of the plates within the spaces between the plates, the spaces must not only be precise at the beginning of each operation, but must not be subject to change during an operation because of warping or thermal distortion of the plates.

While the graphite plates seem to be ideally suited for their use as plates for the workholder, the use of the graphite nevertheless presents a problem. The problem relates to the softness and flakiness of the material for which graphite is known. The softness of the material results in rapid wear of the plates even during normal use such as loading and unloading the wafers. As a result, the life span of the workholders of the CVD apparatus is comparatively short. Furthermore, the problem caused by the short life span of the workholders is aggravated by a rather high replacement cost of the plates. A workholder material having the dimensional stability of graphite and possessing an improved wear resistance over the graphite would therefore be highly desirable.

SUMMARY OF THE INVENTION

According to the invention, a workholder has a conductive base such as graphite, an intermediate layer of relatively higher resistance, such as silicon carbide and an outer conductive layer such as aluminum.

BRIEF DESCRIPTION OF THE DRAWING

Various features and advantages of the present invention will be best understood from the detailed description when read in reference to the accompanying drawing, wherein:

FIG. 1 is a simplified, partially schematic pictorial representation of a plasma reaction apparatus including a typical workholder as improved by features of the invention; and FIG. 2 is a section through one of the plates of the workholder of FIG. 1 which shows various layers in a non-proportionally enlarged thickness scale to highlight a layered structure of such plates as a feature of the present invention.

DETAILED DESCRIPTION

Referring now to FIG. 1, there is shown a schematic representation of a R-F powered plasma treatment apparatus which is designated generally by the numeral 10. The apparatus 10, for purposes of a typical illustration of a preferred embodiment of the invention, is an R-F powered, low temperature chemical vapor deposition (CVD) apparatus. This type of apparatus 10 is a well known process tool used by the semiconductor industry in forming thin layers of material, such as passivating layers or semiconductor epitaxial layers on semiconductor wafers 11.

Typically, such CVD apparatus 10 includes an evacuable enclosure, which is shown in FIG. 1 as a horizontally mounted process tube 12. The tube 12, to become evacuated is capable of being sealed at both ends, typically with a hermetically sealable door 14 at at least one end. An opening 16 which may then be sealed by the door 14 provides access to a chamber 17 to slideably load and unload a workholder 18.

The workholder 18, in the described embodiment, is a mechanical structure of a plurality of parallel plates 19, 21. Major surfaces 22 of the plates 19, 21 which face adjacent ones of such plates and, hence, bound spaces 23 between such plates feature ledges 24 which form seats 25 to slideably accept and retain the wafers 11 which are to be processed. Spacers 26 between the plates 19, 21 maintain a predetermined, precise distance between adjacent plates. Outer surfaces 27 of the plates 21 preferably do not have such ledges 24, inasmuch as a reaction in the process chamber 17 will take place in the spaces 23 between adjacent ones of the plates 19, 21.

The workholder 18 with the wafers 11 inserted into the seats 26 is slideably pushed into the tube 12, whereby a typical roller-undercarriage 28 prevents the plates 19, 21 from contacting the wall of the tube. Within the chamber 17 the plates 19, 21 become coupled to a radio frequency (R-F) power generator 29. The connections are made in a manner by which adjacent plates become coupled to terminals 31, 32 of opposite polarity of the R-F generator 29. To permit each of the plates to become an electrode in an R-F circuit and an R-F current emitter, the plates are conductive to the applied R-F power. Thus, when the workholder has been loaded into the chamber and the chamber has been evacuated by a typical vacuum pumping system schematically referred to by the arrow 34, reactant gases can be introduced into the chamber 17 and a plasma can be generated in each of the spaces between the plates to subject the wafers 11 to the intended reactive treatment.

Problem with the plates of prior art workholders are related to the softness of the graphite material of which the plates of such workholders were made. Graphite is known to be soft and is easily abraded. Consequently, the ledges of such prior art plates quickly wear to render the workholder useless.

Referring now to FIG. 2, there is shown a section through one of the plates 19, 21 to highlight features of the present invention. It is to be noted, however, that in order to show and portray the order and relationship of various layers of material with respect to each other in a layered structure 40 of such plates, the relative thicknesses of the material layers are not drawn to scale in proportion to the true dimensions of each of the component materials.

FIG. 2 shows the actual shape of the plate in the form of a base structure 41, the material structure of the plate 21 being typical of the structures of all of the plates 19, 21. The material of the base structure 41, similar to the material of prior art plates is in the preferred embodiment described herein, a commercially available, purified graphite. The base structure may be formed, such as by machining the graphite to the desired dimensions, inasmuch as the thicknesses of further layers 43 and 44 have substantially no effect on the final dimensions of the plates and on the dimensions of the more detailed features thereof, such as holes, not shown, which are used for assembly purposes, or the ledges 24 of the seats 24.

An inner layer 43 which is formed directly on the graphite of the base structure 41 is a layer of silicon carbide. The silicon carbide layer 43 is formed in a commercially available process which is believed to be a high-temperature chemical vapor deposition process, wherein reactant gases, such as silane react and form the layer 43 on the surface of the graphite structure 41. The thickness of the obtained silicon carbide layer 43 is believed to be typically in the order of 25 microns ($25 \times 10^{-6}$ meters). However, thickness values which are typically achieved by such commercial operation may fall well outside such thickness values and are likely to range approximately from 1 to 50 microns.

The silicon carbide layer 43 is a hard layer and converts the surfaces of the base structures 41 of the plates to wear resistant surfaces. However, two problems are incurred which make the silicon carbide layer 43 by itself unsuitable for protecting the surface of the base structure 41 from abrasion.

A first problem relates directly to the permanence of the silicon carbide layer 43. Chemical vapor deposition operations, to which the plates 19, 21 typically become exposed, leave films of material on those surface portions 46 (see FIG. 1) which during such CVD operations are not shielded by the wafers 11. To maintain substantially similar plasma conditions in each of a great number of successive operations to which the workholder 18 is subjected, such films of deposited material need to be removed periodically after a CVD operation. Such removal of the deposited films, such as silicon nitride films, is readily accomplished in a plasma etching operation in the reaction chamber wherein the typical CVD reactant gases are replaced by a corrosive etching or cleaning gas. Unfortunately, however, the chemical reaction which removes the deposited films also attacks and readily removes silicon carbide layer 43.

A second problem which occurs when a layer of silicon carbide protects the graphite base structure 41 is an even more severe problem that the first mentioned problem in that it affects even an initial operation wherein such a workholder is used. Silicon carbide shows, in contrast to the underlying graphite base structure, a comparatively high resistance to electric current flow, even at radio frequencies. It is therefore believed that observed non-uniformities in CVD operations wherein a workholder was used which was coated only with a single layer of silicon carbide resulted from plasma non-uniformities induced by non-uniform resistances in the silicon carbide layer.

Because of the two mentioned problems associated with the silicon carbide protective layer as a single protective surface layer of the base structure 41, silicon carbide material as a surface protective layer appears to be less than suitable. When, however, the plates 19, 21 are further protected by an additional layer of aluminum, which is shown in FIG. 2 as the outermost layer 44, both disadvantages associated with silicon carbide as a protective layer are overcome.

While aluminum as a material for the base structure 41 of the plates 19, 21 was found to distort and warp due to process related thermal expansion, a similar deleterious effect is absent when aluminum is used as the outer, protective layer 44 to cover the silicon carbide layer 43. A wavy surface texture of the silicon carbide layer 43 is believed to provide a basis for the aluminum to permit thermal expansion perpendicular to the surface without any noticeable strain or cracking in the layer 44 itself. Consequently, the resulting outer aluminum layer 44 appears to be thermally stable within the operating temperature range of the apparatus as it may typically range from room temperature to temperatures in excess of 400° C.

The mechanical stability of the aluminum layer 44 applied to the silicon carbide layer 43 is in sharp contrast to that of a similar aluminum layer applied as an outer protective layer directly to the graphite base structure 41. When an aluminum layer was applied directly to the graphite base structure 41, the characteristic lack of wear resistance of the graphite was transferred directly to the aluminum, such that the rapid wear characteristic of the graphite was not eliminated. In contrast thereto, the aluminum layer 44 when applied to the already present silicon carbide layer 43 results in an improved wear resistance of the plates 19, 21.

The usefulness of the resultant plate structure is multi-faceted. As part of the layered structure 40, the outer aluminum layer 44 shields the silicon carbide layer from becoming corrosively etched in an etch-cleaning operation, and also exhibits to a large extent the wear resistance characteristics of the silicon carbide. The outer layer 44 further reverses the inherent detriment of the silicon carbide layer which could otherwise have resulted in non-uniform plasma reactions. Apparently, the aluminum, as a good conductor, provides an excellent electrical contact to the backside of the wafers 11 and uniformly redistributes the R-F field over the entire surface of the respective plate. A uniformity of the plasma-generating field is found to be present at a deposited thickness of the aluminum layer 44 of one micron. A preferred layer 44 is deposited in a commercial sputter-deposition operation whereby a film thickness in a range between one-half and three microns is preferred. Because of the comparatively high conductivity of the aluminum relative to the conductivity of the silicon carbide layer 43, the thickness of the aluminum can vary from such preferred range, and differences in the thickness in the aluminum layer 44 apparently do not affect the uniformity of the plasma reaction.

Improvements in addition to the described features of the layered plate structure 40 are consequently further found in a subtle distinction of the plasma treatment process over prior art plasma treatments in that the layered structure 40 of the plates 19, 21 appears to provide a capacitative coupling between the base structure 41 and the outer layer 44 to yield a more uniform plasma generation. In generating a plasma in accordance with the described features, an R-F power is applied to an inner conductive body, such as the base structure 41 of an electrode, such as the plate 21. The applied R-F power is emitted from a conductive surface layer 44 spaced from the body by the intermediate layer 43, the intermediate layer having a relatively high resistance relative to the body and to the outer layer 44.

In reading the above-described example and preferred embodiment of the invention, it should be kept in mind, that various changes and modifications can be made to the structure of the workholder 18 and the plates 19, 21 as well as to the manner of contacting the wafers and applying a R-F power though the layered structure of the electrode plate 19, 21 without departing from the spirit and scope of the invention. It is, for example, deemed to be within a broader scope of one embodiment of the invention to apply the advantageous results of a combination of layers to the base structure 41 of the plates 19, 21. Consequently, it may be possible to form the base structure 41 of a non-conductive base material, such as any thermally stable ceramic such as alumina, and then to sputter coat such non-conductive base structure with a suitable conductive material, such as the described aluminum, to form a conductive layer. Depending on power requirements and on the employed frequency of the respective R-F powered CVD or plasma etching process, second and third layers similar to the silicon carbide layer 43 and the outer conductive layer 44 may then be added to enhance distributive electrical radiating characteristics.

Other changes, depending of course on particular process characteristics, may involve changing the materials of the layered structure within the scope of the advantages set forth herein to meet particular needs. Such changes and modifications include mere changes in the thickness of the layers as well as changes in the size and shape or in the spacial relationship of the described plates. For example, spaced, concentric tubes may replace the flat rectangular plates as supports and electrodes.

What is claimed is:

1. A workholder comprising:
   a body structure having the shape of the workholder, the body structure being electrically conductive;
   a first protective layer of a material of relatively higher electrical resistance than the resistance of the body structure, said first protective layer substantially covering the surfaces of the body structure; and
   a second protective layer covering the surfaces of said first protective layer, said second protective layer having an electrical resistance which is relatively lower than the electrical resistance of said first protective layer, said second protective layer being resistive to an etch cleaning process.

2. A workholder according to claim 1, wherein the material of the body structure is a ceramic which is covered with a layer of aluminum to impart conductive characteristics to said body structure.

3. A workholder according to claim 2, wherein the ceramic material is alumina.

4. A workholder according to claim 1, wherein the material of the body structure is graphite, the material of said first protective layer is silicon carbide, and said second protective layer is aluminum.

5. A workholder according to claim 4, wherein the body structure comprises a plurality of parallel, spaced plates, each of the plates having said body structure of graphite, said graphite body structure of each of said plates having said first layer of silicon carbide and said second layer of aluminum.

6. A workholder according to claim 5, wherein the graphite of the body structures of each of the plates is a commercially purified graphite, and said first layer of silicon carbide has a thickness in the range between 10 and 50 microns.

7. A workholder according to claim 6, wherein said second layer of aluminum is a sputtered layer of aluminum having a thickness in the range between one-half and three microns.

8. A workholder according to claim 7, wherein the plates are adapted to couple the body structures of adjacent ones of the plates to opposite polarities of an R-F power source.

9. A workholder adapted (for use in a plasma reactive treatment process, comprising:
 a plurality of spaced, parallel plates, each of the plates having an underlying structure imparting a desired shape to each of such plates; and
 an outer layer of aluminum, covering each of such plates.

10. A workholder according to claim 9, wherein said underlying structure of each of said plates comprises:
 a base structure of graphite; and
 a first protective layer of silicon carbide covering the surface of said base structure.

11. A workholder according to claim 9, wherein said underlying structure of each of said plates is of a ceramic material.

12. A workholder according to claim 9, wherein said underlying structure of each of said plates comprises:
 a base structure of a ceramic material;
 a conductive layer covering the surface of such ceramic material; and
 a resistive layer of comparatively high resistance relative to said conductive layer and to said outer layer, and resistive layer covering said conductive layer and being interposed between said conductive layer and said outer layer of aluminum.

13. A method of supporting workpieces during a plasma reactive treatment, which comprises:
 supporting such workpieces against mutually facing, spaced surfaces of electrodes, each of such electrodes comprising a conductive base structure, an intermediate layer of relatively high resistance with respect to such conductive base structure, and an outer conductive layer of relatively low resistance with respect to such intermediate layer;
 applying an R-F power signal between the base structures of said electrodes; and
 radiating such R-F power signal from such outer, conductive layer between such spaced surfaces to generate a plasma between such electrodes to treat said supported articles.

14. A method of supporting workpieces during a plasma reactive treatment according to claim 13, wherein the conductive base of such electrodes is graphite, said intermediate layer is a structurally hard silicon carbide layer, and said outer layer is an aluminum layer, wherein said workpieces are contacted against said aluminum surface, and an R-F power signal is capacitatively transmitted through said silicon carbide layer and uniformly radiated from such aluminum layer to generate such plasma.

* * * * *

UNITED STATES PATENT AND TRADEMARK OFFICE
CERTIFICATE OF CORRECTION

PATENT NO. : 4,424,096
DATED : January 3, 1984
INVENTOR(S) : H. Y. Kumagai

It is certified that error appears in the above—identified patent and that said Letters Patent is hereby corrected as shown below:

Column 6, line 12, "though" should read --through--. In the claims, Column 7, claim 9, line 16, "(for" should read --for-- (our error). Column 8, claim 12, line 5, "and" should read --said--.

Signed and Sealed this

Fifth Day of June 1984

[SEAL]

Attest:

Attesting Officer

GERALD J. MOSSINGHOFF
Commissioner of Patents and Trademarks